(12) United States Patent
Lee et al.

(10) Patent No.: US 7,391,249 B2
(45) Date of Patent: Jun. 24, 2008

(54) MULTI-THRESHOLD CMOS LATCH CIRCUIT

(75) Inventors: Dae Woo Lee, Daejeon (KR); Yil Suk Yang, Daejeon (KR); Gyu Hyun Kim, Daejeon (KR); Soon Il Yeo, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 88 days.

(21) Appl. No.: 11/607,743

(22) Filed: Dec. 1, 2006

(65) Prior Publication Data

US 2007/0126486 A1    Jun. 7, 2007

(30) Foreign Application Priority Data

Dec. 7, 2005   (KR) ............... 10-2005-0119077
Jun. 30, 2006   (KR) ............... 10-2006-0060355

(51) Int. Cl.
*H03K 3/289* (2006.01)
(52) U.S. Cl. ............... 327/202; 327/203; 327/214; 327/218
(58) Field of Classification Search ............... 327/199, 327/201–203, 208, 210–212, 214, 218, 225
See application file for complete search history.

(56) References Cited

U.S. PATENT DOCUMENTS 5,321,316 A * 6/1994 Nakajima ............... 327/208
6,538,471 B1 * 3/2003 Stan et al. ............... 326/46
6,794,914 B2 9/2004 Sani et al.
6,850,103 B2 * 2/2005 Ikeno et al. ............... 327/202
6,870,412 B2 3/2005 Cho
7,069,522 B1 * 6/2006 Sluss et al. ............... 716/1
7,248,090 B2 * 7/2007 Ramprasad ............... 327/202

FOREIGN PATENT DOCUMENTS

JP   2004-248143   9/2004
KR  1020040040732  5/2004

OTHER PUBLICATIONS

"1-V Power Supply High-Speed Digital Circuit Technology with Multithreshold-Voltage CMOS." Shin'ichiro Mutoh et al. IEEE Journal of Solid-State Circuits. Aug. 8, 1995. vol. 30, No. 8. pp. 847-854.
"A 1-V High-Speed MTCMOS Circuit Scheme for Power-Down Application Circuits." Satoshi Shigematsu et al. IEEE Journal of Solid-State Circuits. Jun. 6, 1997. vol. 32, No. 6. pp. 861-869.

* cited by examiner

*Primary Examiner*—N. Drew Richards
*Assistant Examiner*—Hai L. Nguyen
(74) *Attorney, Agent, or Firm*—Ladas & Parry LLP

(57) ABSTRACT

Provided is a multi-threshold complementary metal oxide semiconductor (MTCMOS) latch circuit including: a data inverting circuit for inverting and outputting input data under the control of a sleep control signal; a transmission gate for transferring the data signal output from the data inverting circuit under the control of a clock control signal; a signal control circuit for outputting the data signal output from the transmission gate under the control of a reset control signal and the sleep control signal; and a feedback circuit for feeding back the signal output from the signal control circuit and preserving the data in a sleep mode. The MTCMOS latch circuit can minimize power consumption caused by a leakage current due to elements scaled down to nano scale and also contribute to high-speed operation of a logic circuit by using an element having a low threshold voltage.

13 Claims, 7 Drawing Sheets

MULTI-THRESHOLD CMOS LATCH CIRCUIT

CROSS-REFERENCE TO RELATED APPLICATION

This application claims priority to and the benefit of Korean Patent Application Nos. 2005-119077, filed Dec. 7, 2005, and 2006-60355, filed Jun. 30, 2006, the disclosures of which are incorporated herein by reference in their entirety.

BACKGROUND

1. Field of the Invention

The present invention relates to a multi-threshold complementary metal oxide semiconductor (MTCMOS) latch circuit capable of preserving data without a leakage current during a sleep mode using MTCMOS technology.

2. Discussion of Related Art

A latch circuit has one data input, one clock input, and one output. When the clock input is activated, input data is received and transferred to an output side, and when the clock input is deactivated, the data is preserved in a feedback circuit.

FIG. 1 is a circuit diagram of a conventional latch circuit using a single threshold voltage, FIG. 2 is a circuit diagram of a conventional clock signal generation circuit, and FIGS. 3A to 3C illustrate transistor equivalents of elements shown in FIG. 1.

Referring to FIGS. 1 to 3C, the latch circuit using a single threshold voltage includes a transmission gate 100 controlled by a clock signal CP and an inverted clock signal CPb, a NAND gate 110 outputting data D in response to a reset control signal RS, a first inverter 120 inverting the signal output from the NAND gate 110, and a feedback transmission gate 130.

The clock signal CP and the inverted clock signal CPb are generated by the clock signal generation circuit shown in FIG. 2. The clock signal generation circuit includes a second inverter 210 and a third inverter 220.

Therefore, when a clock control signal CLK in a high state is input, the inverted clock signal CPb in a low state is output by the second inverter 210, and the clock signal CP in the high state is output by the second inverter 210 and the third inverter 220. On the contrary, when the clock control signal CLK in a low state is input, the inverted clock signal CPb in a high state is output by the second inverter 210, and the clock signal CP in the low state is output by the second inverter 210 and the third inverter 220.

As illustrated in FIG. 3A, the transmission gate 100 consists of a p-channel metal oxide semiconductor (PMOS) transistor and n-channel metal oxide semiconductor (NMOS) transistor having a medium threshold voltage.

As illustrated in FIG. 3B, the NAND gate 110 consists of PMOS transistors and NMOS transistors having a medium threshold voltage.

As illustrated in FIG. 3C, the first, second and third inverters 120, 210 and 220 each consist of a PMOS transistor and NMOS transistor having a medium threshold voltage.

Operation of the latch circuit constructed as described above will be described below.

When the reset control signal RS is in a low state, the NAND gate 110 outputs the signal in a high state regardless of an input state of the data D, and an output Q is maintained in a low state by the first inverter 120.

On the contrary, when the reset control signal RS is in a high state and the clock control signal CLK is in a high state, the clock signal CP becomes the high state and the inverted clock signal CPb becomes the low state. Thus, the transmission gate 100 becomes an on state and the feedback transmission gate 130 becomes an off state.

Here, when the data D is in a high state, the output Q becomes a high state, and when the data D is in a low state, the output Q becomes a low state.

In addition, when the clock control signal CLK is in a low state, the transmission gate 100 becomes an off state and the feedback transmission gate 130 becomes an on state. Thus, the output Q is maintained in a state of previous data.

However, the conventional latch circuit using a single threshold voltage as described above has problems in achieving high performance and low power consumption due to a leakage current caused by scaled-down elements.

SUMMARY OF THE INVENTION

The present invention is directed to a multi-threshold complementary metal oxide semiconductor (MTCMOS) latch circuit capable of uniformly maintaining data when switching from an active mode to a sleep mode.

The present invention is also directed to an MTCMOS latch circuit for high speed and low power consumption capable of preserving data without a leakage current when switching from an active mode to a sleep mode.

One aspect of the present invention provides an MTCMOS latch circuit, comprising: a data inverting circuit for inverting and outputting input data under the control of a sleep control signal; a transmission gate for transferring the data signal output from the data inverting circuit under the control of a clock control signal; a signal control circuit for outputting the data signal output from the transmission gate under the control of a reset control signal and the sleep control signal; and a feedback circuit for feeding back the signal output from the signal control circuit and preserving the data in a sleep mode, wherein the feedback circuit comprises: a second inverter for inverting and outputting the signal output from the signal control circuit; a third p-channel metal oxide semiconductor (PMOS) transistor having a source for receiving the signal output from the signal control circuit, a gate for receiving the signal output from the second inverter, and a drain connected to an output; and a third n-channel metal oxide semiconductor (NMOS) transistor having a drain connected to a logic gate of the signal control circuit, a gate for receiving the signal output from the second inverter, and a source connected to ground.

The data inverting circuit may comprise: a first inverter for inverting and transferring the input data to the transmission gate; a first PMOS transistor having a source connected to a power supply voltage, a gate to which a sleep signal is input, and a drain connected to the first inverter; and a first NMOS transistor having a drain connected to the first inverter, a gate to which an inverted sleep signal is input, and a source connected to ground, wherein the first PMOS transistor and the first NMOS transistor may have a high threshold voltage.

The signal control circuit may comprise: the logic gate for receiving and outputting the output signal of the transmission gate under the control of the reset control signal, a sleep signal, and an inverted sleep signal; a second PMOS transistor having a source connected to the power supply voltage, a gate to which the sleep signal is input, and a drain connected to the logic gate; and a second NMOS transistor having a drain connected to the logic gate, a gate for receiving the inverted sleep signal, and a source connected to ground, wherein the second PMOS transistor and the second NMOS transistor may have a high threshold voltage.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the exemplary embodiments disclosed below and can be implemented in various forms. Therefore, the present exemplary embodiments are provided for complete disclosure of the present invention and to fully inform the scope of the present invention to those of ordinary skill in the art.

In the case of a 130 nm transistor operating at 1.2 V, a low threshold voltage is generally considered to be about 0.24 V or less and a high threshold voltage is generally considered to be about 0.44 V or more.

Figure 1:
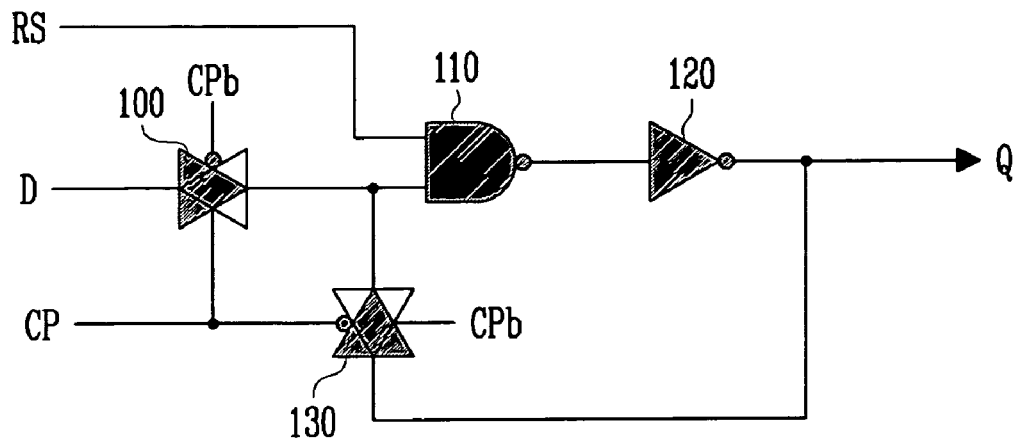
FIG. 1 is a circuit diagram of a conventional latch circuit using a single threshold voltage.
Figure 2:
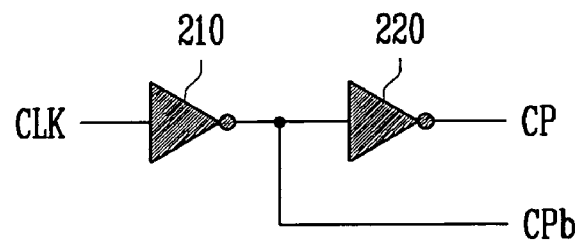
FIG. 2 is a circuit diagram of a conventional clock signal generation circuit.
Figure 3A:
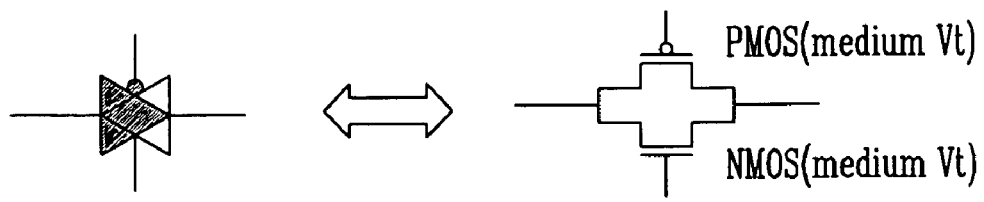
FIG. 3A to 3C are circuit diagrams illustrating transistor equivalents of elements shown in FIG. 1.
Figure 3B:
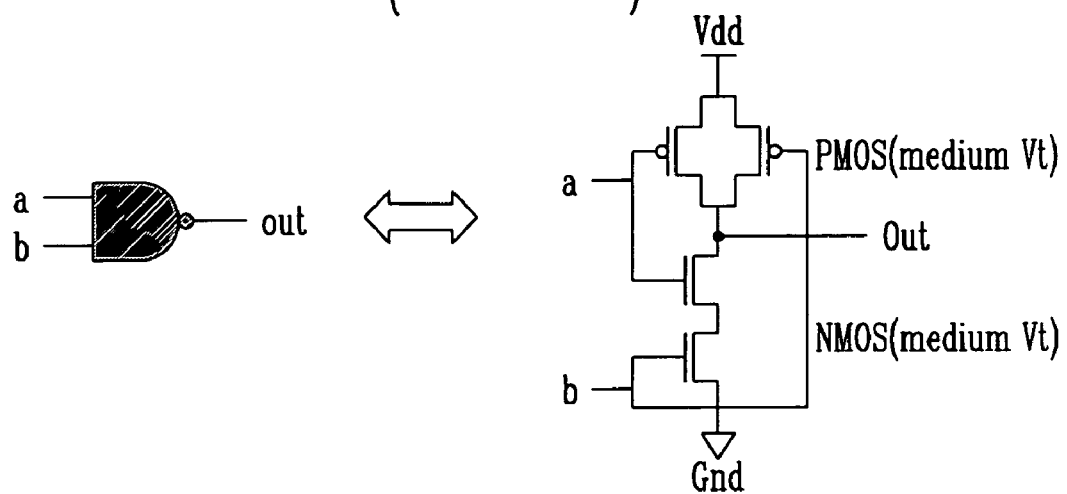
Figure 3C:
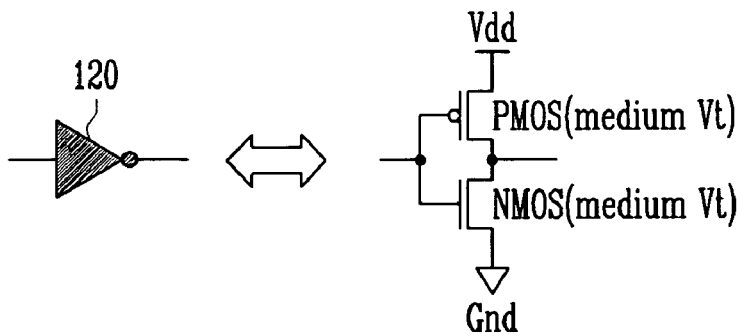
Figure 4:
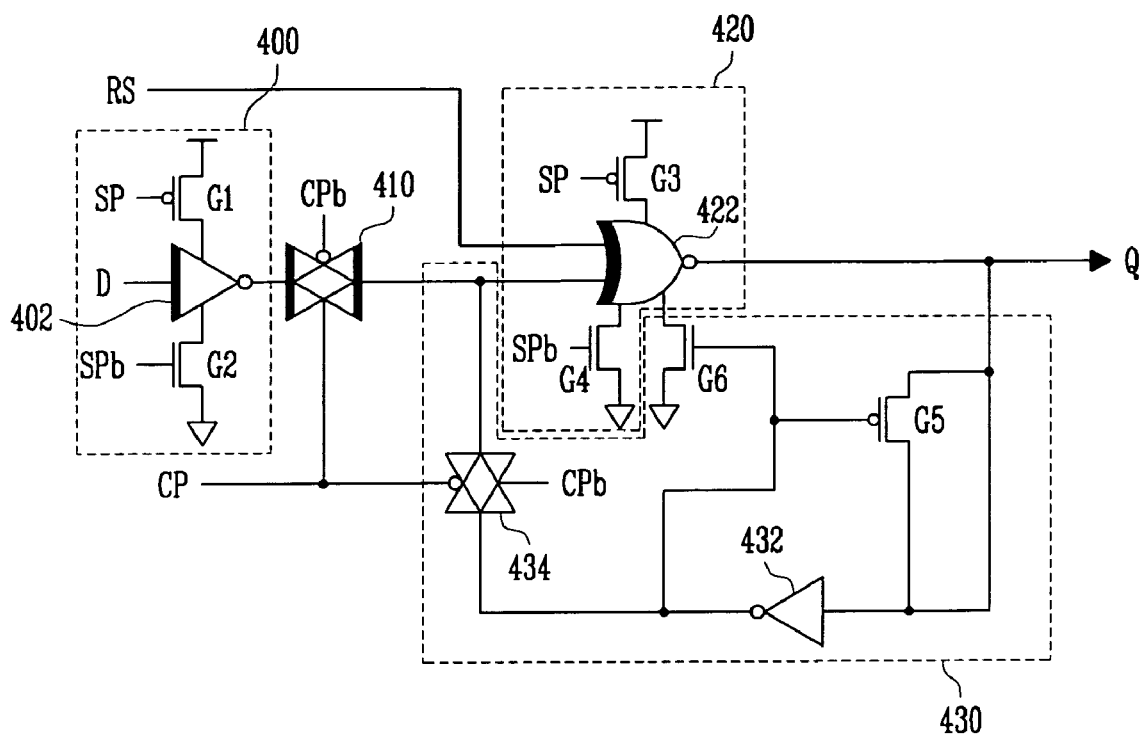
FIG. 4 is a circuit diagram of a multi-threshold complementary metal oxide semiconductor (MTCMOS) latch circuit according to an exemplary embodiment of the present invention.
Figure 5:
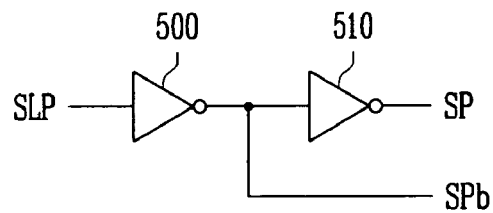
FIG. 5 is a circuit diagram of a sleep signal generation circuit according to an exemplary embodiment of the present invention.
Figure 6:
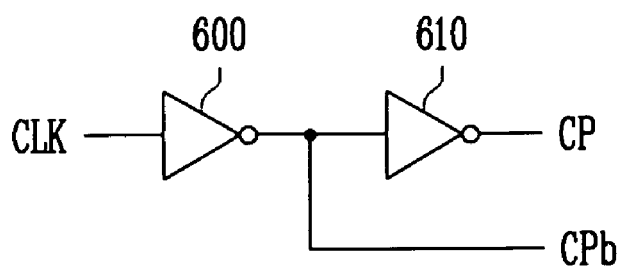
FIG. 6 is a circuit diagram of a clock signal generation circuit according to an exemplary embodiment of the present invention.

FIG. 4 is a circuit diagram of a multi-threshold complementary metal oxide semiconductor (MTCMOS) latch circuit according to an exemplary embodiment of the present invention, FIG. 5 is a circuit diagram of a sleep signal generation circuit according to an exemplary embodiment of the present invention, FIG. 6 is a circuit diagram of a clock signal generation circuit according to an exemplary embodiment of the present invention, and FIGS. 7A to 7E are circuit diagrams respectively illustrating individual circuits of the MTCMOS latch circuit shown in FIG. 4.

Referring to FIG. 4, the MTCMOS latch circuit includes a data inverting circuit 400, a transmission gate 410, a signal control circuit 420, and a feedback circuit 430. The data inverting circuit 400 inverts and outputs input data D under the control of a sleep signal SP and an inverted sleep signal SPb. The transmission gate 410 transfers the data signal output from the data inverting circuit 400 under the control of a clock control signal CLK. The signal control circuit 420 outputs the data signal output from the transmission gate 410 under the control of a reset control signal RS and a sleep control signal SLP. The feedback circuit 430 feeds back the signal output from the signal control circuit 420 and preserves the data in a sleep mode.

The inverting circuit 400 includes a first inverter 402, a first p-channel metal oxide semiconductor (PMOS) transistor G1, and a first n-channel metal oxide semiconductor (NMOS) transistor G2. The first inverter 402 receives and inverts the input data D. The first PMOS transistor G1 has a source connected to a power supply voltage, a gate receiving the sleep signal SP, and a drain connected to the first inverter 402. The first NMOS transistor G2 has a drain connected to the first inverter 402, a gate receiving the inverted sleep signal SPb, and a source connected to ground.

Here, the first inverter 402 consists of a PMOS transistor and an NMOS transistor that have a low threshold voltage to transfer data through the shortest path.

Figure 7A:
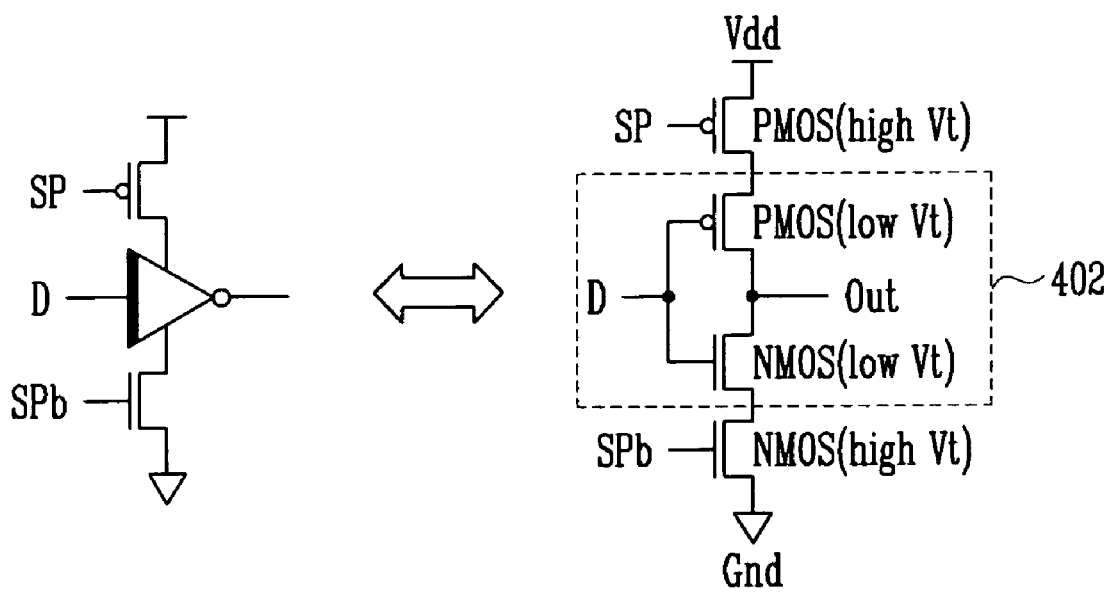
FIG. 7A to 7E are circuit diagrams respectively illustrating individual circuits in the MTCMOS latch circuit shown in FIG. 4.

The inverting circuit 400 is expressed as an equivalent circuit as shown in FIG. 7A.

Referring to FIG. 7A, the first PMOS transistor G1 and the first NMOS transistor G2 have a high threshold voltage, and the first inverter 402 consists of a PMOS transistor and an NMOS transistor that have a low threshold voltage.

Figure 7B:
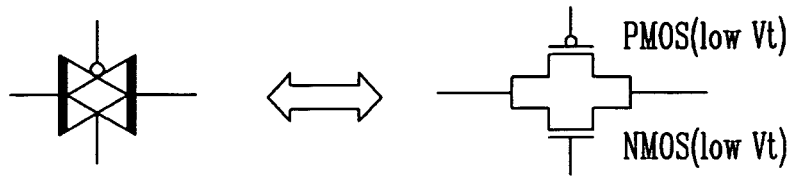

The transmission gate 410 transfers the data signal output from the data inverting circuit 400 to the signal control circuit 420 under the control of the clock signal CP and the inverted clock signal CPb, and consists of a PMOS transistor and an NMOS transistor that have a low threshold voltage as illustrated in FIG. 7B.

The signal control circuit 420 includes a NOR gate 422, a second PMOS transistor G3, and a second NMOS transistor G4. The NOR gate 422 receives and outputs the output signal of the transmission gate 410 under the control of the reset control signal RS, sleep signal SP, and inverted sleep signal SPb. The second PMOS transistor G3 has a source connected to the power supply voltage, a gate receiving the sleep signal SP, and a drain connected to the NOR gate 422. The second NMOS transistor G4 has a drain connected to the NOR gate, a gate receiving the inverted sleep signal SPb, and a source connected to ground.

Figure 7C:
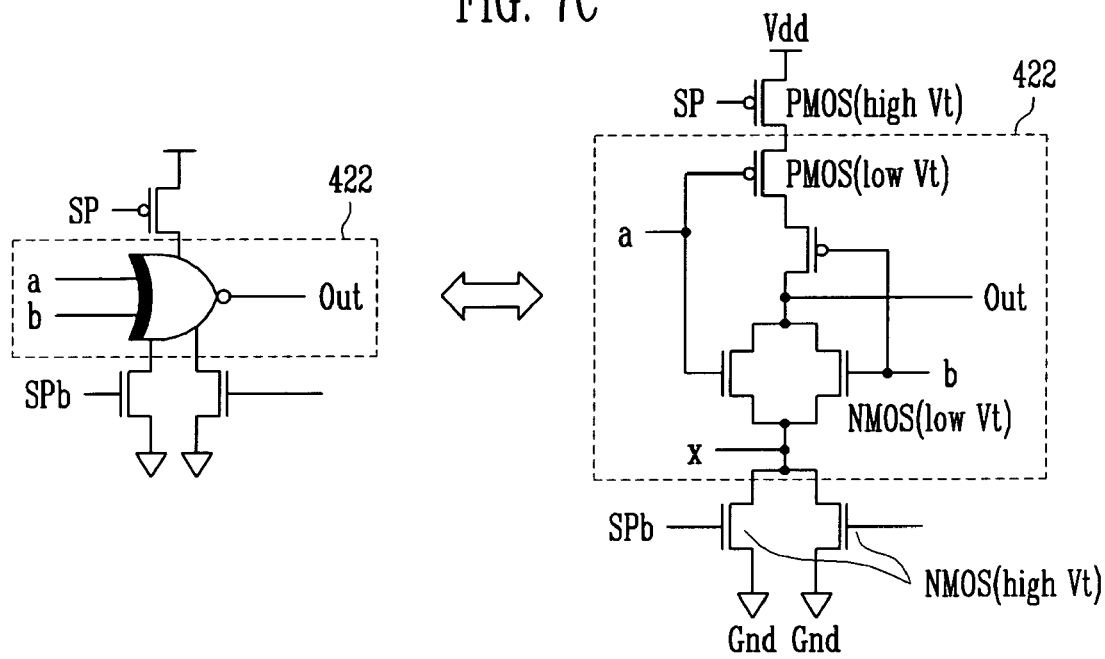

The signal control circuit 420 has the equivalent circuit shown in FIG. 7C, in which the second PMOS transistor G3 and the second NMOS transistor G4 have a high threshold voltage, and the NOR gate 422 consists of PMOS transistors and NMOS transistors that have a low threshold voltage.

The feedback circuit 430 maintains data when the MTCMOS latch circuit operates in the sleep mode, and consists of PMOS transistors and NMOS transistors having a low leakage current and a high threshold voltage.

The feedback circuit 430 includes a second inverter 432, a third PMOS transistor G5, a third NMOS transistor G6, and a feedback transmission gate 434. The second inverter 432 inverts and outputs a signal Q output from the signal control circuit 420. The third PMOS transistor G5 has a source receiving the signal Q output from the signal control circuit 420, a gate receiving the signal output from the second inverter 432, and a drain connected to the output Q. The third NMOS transistor G6 has a drain connected to the NOR gate 422 of the signal control circuit 420, a gate receiving the signal output from the second inverter 432, and a source connected to ground. The feedback transmission gate 434 receives and transfers the output signal of the second inverter 432 to the signal control circuit 420 under the control of the clock signal CP and the inverted clock signal CPb.

Figure 7D:
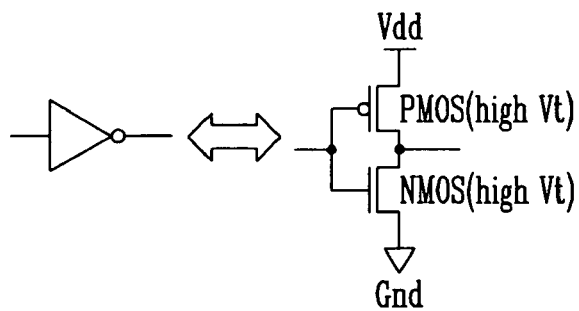
Figure 7E:
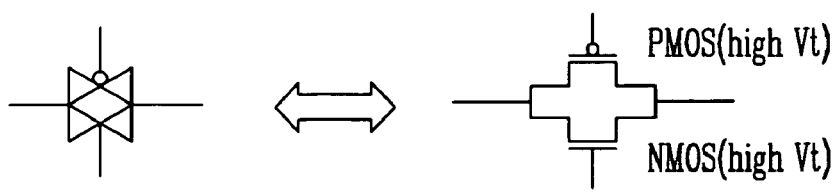

The second inverter 432 consists of a PMOS transistor and an NMOS transistor that have a high threshold voltage as shown in FIG. 7D, and the feedback transmission gate 434 consists of a PMOS transistor and an NMOS transistor that have a high threshold voltage as shown in FIG. 7E.

Operation of the MTCMOS latch circuit constructed as described above will be described below.

In the MTCMOS latch circuit, when the reset control signal RS is in a high state, the output Q becomes a low state regardless of input states of the data D and the sleep control signal SLP.

When the reset control signal RS is in the low state, the MTCMOS latch circuit operates in an active mode or sleep mode according to the sleep control signal SLP.

More specifically, when the reset control signal RS is in the low state and the sleep control signal SLP is in the low state, the MTCMOS latch circuit operates in the active mode. And, when the sleep control signal SLP is in the high state, the MTCMOS latch circuit operates in the sleep mode.

First, operation of the MTCMOS latch circuit in the active mode will be described below.

When the reset control signal RS is in the low state and the sleep control signal SLP is in the low state, the first and second PMOS transistors G1 and G3 and the first and second NMOS transistors G2 and G4 all having a high threshold voltage become an on state.

More specifically, when the sleep control signal SLP is low, the sleep signal SP in the low state and the inverted sleep signal SPb in the high state are generated by the sleep signal generation circuit as shown in FIG. 5.

Then, the first and second PMOS transistors G1 and G3 and the first and second NMOS transistors G2 and G4 all having a high threshold voltage become the on state by the sleep signal SP in the low state and the inverted sleep signal SPb in the high state.

In this condition, when the clock control signal CLK is in the high state, the clock signal CP becomes the high state and the inverted clock signal CPb becomes the low state by the clock signal generation circuit as shown in FIG. 6. Thus, the transmission gate 410 becomes the on state and the feedback transmission gate 434 becomes the off state.

Consequently, the input data D is output through the data inverting circuit 400, the transmission gate 410, and the signal control circuit 420.

On the contrary, when the clock control signal CLK is in the low state while the reset control signal RS is in the low state and the sleep control signal SLP is in the low state as described above, the clock signal CP becomes the low state and the inverted clock signal CPb becomes the high state. Then, the transmission gate 410 becomes the off state, the feedback transmission gate 434 becomes the on state, and thus previous data D is output.

When the MTCMOS latch circuit operates in the active mode as described above, it continuously outputs data D according to the high/low state of the clock control signal CLK.

When the MTCMOS latch circuit operates in the active mode as described above, data transmission is very fast because the first inverter 402 and the transmission gate 410 in the data inverting circuit 400, and the NOR gate 422 in the signal control circuit 420, all consist of a PMOS transistor and an NMOS transistor that have a low threshold voltage.

Referring to FIG. 5, the sleep signal generation circuit includes a third inverter 500 inverting the sleep control signal SLP and outputting the inverted sleep signal SPb, and a fourth inverter 510 inverting the signal output from the third inverter 500 and outputting the sleep signal SP.

Therefore, when the sleep control signal SLP in the low state is input, the sleep signal generation circuit outputs the sleep signal SP in the low state and the inverted sleep signal SPb in the high state. On the contrary, when the sleep control signal SLP in the high state is input, the sleep signal generation circuit outputs the sleep signal SP in the high state and the inverted sleep signal SPb in the low state.

Referring to FIG. 6, the clock signal generation circuit includes a fifth inverter 600 inverting the clock control signal CLK and outputting the inverted clock signal CPb, and a sixth inverter 610 inverting the signal output from the fifth inverter 600 and outputting the clock signal CP.

Therefore, when the clock control signal CLK in the low state is input, the clock signal generation circuit outputs the clock signal CP in the low state and the inverted clock signal CPb in the high state. On the contrary, when the clock control signal CLK in the high state is input, the clock signal generation circuit outputs the clock signal CP in the high state and the inverted clock signal CPb in the low state.

Next, operation of the MTCMOS latch circuit in the sleep mode will be described below.

When the reset control signal RS is in the low state and the sleep control signal SLP is in the high state, the MTCMOS latch circuit operates in the sleep mode.

Therefore, when the reset control signal RS is in the low state and the sleep control signal SLP is in the high state, i.e., the sleep signal SP is in the high state and the inverted sleep signal SPb is in the low state, the first and second PMOS transistors G1 and G3 and the first and second NMOS transistors G2 and G4 that have a high threshold voltage become the off state. Thus, a data state of the output Q is preserved in the feedback circuit 430.

More specifically, when the output Q is in the low state, a high level signal is applied to the gate of the third NMOS transistor G6 by the second inverter 432 and the third NMOS transistor G6 is turned on. In addition, the high level signal is applied to the gate of the third PMOS transistor G5 and the third PMOS transistor G5 is turned off.

Here, when the clock control signal CLK is in the low state, the feedback transmission gate 434 becomes the on state. Then, the high level signal is applied to the NOR gate 422 and the output Q becomes the low state. Here, the output Q is connected to ground through an NMOS transistor in the NOR gate 422 and the third NMOS transistor G6 as shown in the NOR gate circuit of FIG. 7C, and thus is maintained in the low state.

On the contrary, when the output Q is in the high state, a low level signal is applied to the gate of the third NMOS transistor G6 by the second inverter 432 and the third NMOS transistor G6 is turned off. Thus, the NOR gate 422 does not operate. The low level signal is also applied to the gate of the third PMOS transistor G5 by the second inverter 432 and the third PMOS transistor G5 is turned on. In addition, the high level signal is applied to the source and drain of the third PMOS transistor G5. Consequently, the output Q is maintained in the high state.

As described above, since the main object of the feedback circuit 430 is simply to maintain data, it consists of PMOS transistors and NMOS transistors having a low leakage current and a high threshold voltage and can be designed to have a minimal size.

Next, when the MTCMOS latch circuit switches from the sleep mode to the active mode, i.e., the sleep control signal SLP becomes the low state in the sleep mode, the MTCMOS latch circuit operates in the active mode.

More specifically, in the MTCMOS latch circuit, when the sleep control signal SLP is in the low state, i.e., the sleep signal SP is in the low state and the inverted sleep signal SPb is in the high state, the first and second PMOS transistors G1 and G3 and the first and second NMOS transistors G2 and G4 that have a high threshold voltage become the on state.

In this condition, when the clock control signal CLK is in the high state, the clock signal CP becomes the high state and the inverted clock signal CPb becomes the low state. Thus, the transmission gate 410 becomes the on state and the feedback transmission gate 434 becomes the off state.

Consequently, the input data D is output through the data inverting circuit 400, the transmission gate 410, and the signal control circuit 420.

On the contrary, when the clock control signal CLK is in the low state, the clock signal CP becomes the low state and the inverted clock signal CPb becomes the high state. Then, the transmission gate 410 becomes the off state, the feedback transmission gate 434 becomes the on state, and thus previous data D is output.

Figure 8:
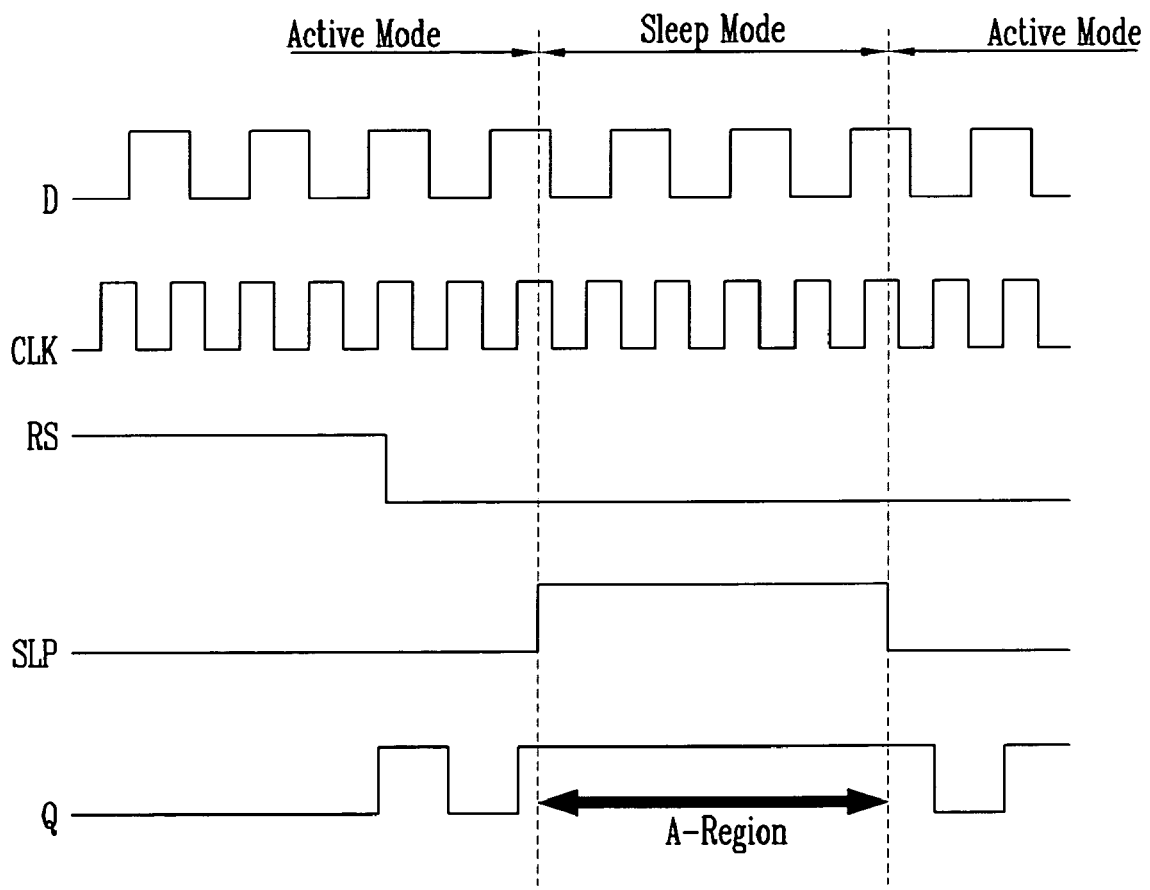
FIG. 8 is a signal operation timing diagram of the MTCMOS latch circuit according to an exemplary embodiment of the present invention.

FIG. 8 is a signal operation timing diagram of the MTCMOS latch circuit according to an exemplary embodiment of the present invention.

Referring to FIG. 8, the output Q in the high state preserved in the sleep mode in which the reset control signal RS is low, the clock control signal CLK is high, and the data signal D is high is maintained as is, in the high state, when the clock control signal CLK and the data signal D both are high upon switching from the sleep mode to the active mode.

It can be seen that edges of A-region of the output Q in the sleep mode are maintained the same before and after the sleep mode.

Figure 9:
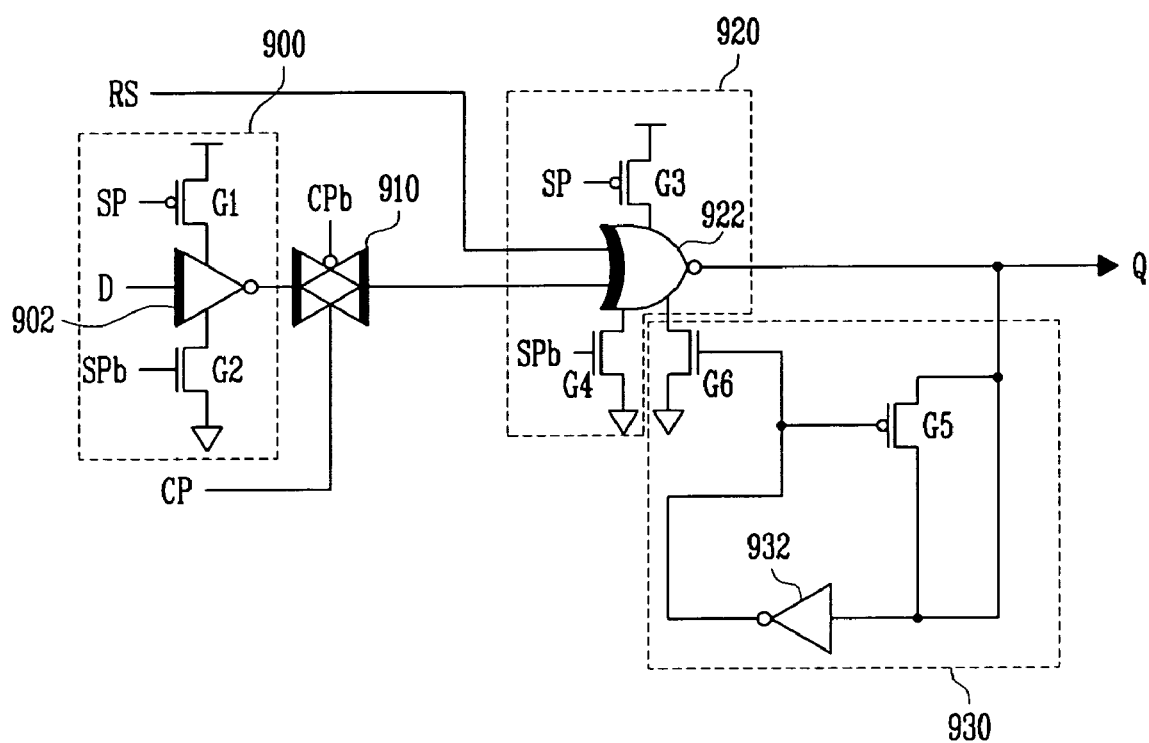
FIG. 9 is a circuit diagram of an MTCMOS latch circuit according to another exemplary embodiment of the present invention.

FIG. 9 is a circuit diagram of an MTCMOS latch circuit according to another exemplary embodiment of the present invention.

Referring to FIG. 9, the MTCMOS latch circuit includes a data inverting circuit 900, a transmission gate 910, a signal control circuit 920, and a feedback circuit 930.

Since the data inverting circuit 900, the transmission gate 910, and the signal control circuit 920 are the same as in FIG. 4, descriptions thereof will be omitted.

In comparison with FIG. 4, the feedback circuit 930 preserves the low state of an output Q using virtual ground (a node x in FIG. 7C) without a feedback transmission gate.

More specifically, when the MTCMOS latch circuit is in the sleep mode and the output Q is in the low state, a high level signal is applied to the gate of a third NMOS transistor G6 and the third NMOS transistor G6 is turned on. In addition, the virtual ground (the node x in FIG. 7C) is formed at the drain of the third NMOS transistor G6. Consequently, the output Q is maintained in the low state.

On the contrary, when the output Q is in the high state, a low level signal is applied to the gate of a third PMOS transistor G5 and the high level signal is applied to the source and drain of the third PMOS transistor G5, similarly to FIG. 4. Consequently, the output Q is maintained in the high state.

As described above, according to the present invention, it is possible to provide an MTCMOS latch circuit capable of minimizing excess power consumption due to a leakage current caused by scaling down of elements to the nano scale, and contributing to high-speed operation of a logic circuit by using elements having a low threshold voltage.

In addition, according to the present invention, a high-speed low-power latch circuit using MTCMOS technology can provide an MTCMOS latch circuit that can be widely used in a high-performance microprocessor, etc. operating as a synchronous sequential system.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A multi-threshold complementary metal oxide semiconductor (MTCMOS) latch circuit, comprising:
    a data inverting circuit for inverting and outputting input data under the control of a sleep control signal;
    a transmission gate for transferring the data signal output from the data inverting circuit under the control of a clock control signal;
    a signal control circuit for outputting the data signal output from the transmission gate under the control of a reset control signal and the sleep control signal; and
    a feedback circuit for feeding back the signal output from the signal control circuit and preserving the data in a sleep mode,
    wherein the feedback circuit comprises:
    a first inverter for inverting and outputting the signal output from the signal control circuit;
    a first p-channel metal oxide semiconductor (PMOS) transistor having a source for receiving the signal output from the signal control circuit, a gate for receiving the signal output from the first inverter, and a drain connected to an output; and
    a first n-channel metal oxide semiconductor (NMOS) transistor having a drain connected to a logic gate of the signal control circuit, a gate for receiving the signal output from the first inverter, and a source connected to ground.

2. The MTCMOS latch circuit of claim 1, wherein the sleep control signal comprises a sleep signal and an inverted sleep signal.

3. The MTCMOS latch circuit of claim 1, wherein the data inverting circuit comprises:
    a second inverter for inverting the input data and transferring the inverted input data to the transmission gate;
    a second PMOS transistor having a source connected to a power supply voltage, a gate for receiving a sleep signal, and a drain connected to the first inverter; and
    a second NMOS transistor having a drain connected to the second inverter, a gate for receiving an inverted sleep signal, and a source connected to ground,
    wherein the second PMOS transistor and the second NMOS transistor have a high threshold voltage.

4. The MTCMOS latch circuit of claim 3, wherein the second inverter comprises PMOS and NMOS transistors having a low threshold voltage.

5. The MTCMOS latch circuit of claim 1, wherein the transmission gate comprises PMOS and NMOS transistors having a low threshold voltage.

6. The MTCMOS latch circuit of claim 1, wherein the transmission gate is turned on when the clock control signal is in a high state.

7. The MTCMOS latch circuit of claim 1, wherein the signal control circuit comprises:
    the logic gate for receiving and outputting the output signal of the transmission gate under the control of the reset control signal, a sleep signal and an inverted sleep signal;
    a second PMOS transistor having a source connected to a power supply voltage, a gate for receiving the sleep signal, and a drain connected to the logic gate; and a second NMOS transistor having a drain connected to the logic gate, a gate receiving an inverted sleep signal, and a source connected to ground, wherein the second PMOS transistor and the second NMOS transistor have a high threshold voltage.

8. The MTCMOS latch circuit of claim 7, wherein the logic gate is one of a NOR gate and an NAND gate.

9. The MTCMOS latch circuit of claim 7, wherein the logic gate comprises PMOS and NMOS transistors having a low threshold voltage.

10. The MTCMOS latch circuit of claim 1, wherein the first PMOS transistor and the first NMOS transistor have a high threshold voltage.

11. The MTCMOS latch circuit of claim 10, wherein the first inverter comprises PMOS and NMOS transistors having a high threshold voltage.

12. The MTCMOS latch circuit of claim 1, wherein the feedback circuit further comprises a feedback transmission gate transferring the output signal of the first inverter to the signal control circuit under the control of the clock control signal.

13. The MTCMOS latch circuit of claim 12, wherein the feedback transmission gate comprises PMOS and NMOS transistors having a high threshold voltage.

* * * * *